US008772136B2

(12) United States Patent
Wang et al.

(10) Patent No.: US 8,772,136 B2
(45) Date of Patent: Jul. 8, 2014

(54) METHOD FOR FABRICATING SEMICONDUCTOR DEVICE

(75) Inventors: Chine-Li Wang, Miaoli County (TW);
Chun-Yen Chen, Keelung (TW);
Wei-Hua Fang, Kaohsiung (TW);
Hung-Hsien Chang, Changhua County (TW); Yung-Chin Yen, Hsinchu County (TW)

(73) Assignee: United Microelectronics Corporation, Hsinchu (TW)

( * ) Notice: Subject to any disclaimer, the term of this patent is extended or adjusted under 35 U.S.C. 154(b) by 183 days.

(21) Appl. No.: 13/483,129

(22) Filed: May 30, 2012

(65) Prior Publication Data

US 2013/0323908 A1    Dec. 5, 2013

(51) Int. Cl.
*H01L 21/78* (2006.01)
*H01L 21/46* (2006.01)
*H01L 21/301* (2006.01)

(52) U.S. Cl.
USPC ............................ 438/462; 438/464; 438/465

(58) Field of Classification Search
USPC .......................................... 438/462, 464, 465
See application file for complete search history.

(56) References Cited

U.S. PATENT DOCUMENTS

| 7,169,248 | B1 * | 1/2007 | Kirby et al. ................. 156/250 |
| 8,053,868 | B2 * | 11/2011 | Ryu et al. ..................... 257/620 |
| 2007/0222037 | A1 | 9/2007 | Wu |
| 2010/0053407 | A1 * | 3/2010 | Crisp et al. .................. 348/311 |
| 2010/0090304 | A1 | 4/2010 | Liu et al. |

OTHER PUBLICATIONS

U.S. Appl. No. 13/438,007, filed on Apr. 3, 2012.

* cited by examiner

*Primary Examiner* — Luan C Thai
(74) *Attorney, Agent, or Firm* — WPAT, PC; Justin King

(57) ABSTRACT

A method for fabricating a semiconductor device, wherein the method comprises steps as follows: Firstly, a device wafer is provided and a patterned bonding layer is then formed within a scribe line region of the device wafer. Subsequently a handle wafer is bonded to the device wafer by the patterned bonding layer. Next, a dicing process is performed along the scribe line region in order to divide the device wafer into a plurality of dices and remove the patterned bonding layer simultaneously, whereby the divided dices can be separated from the handle wafer.

11 Claims, 8 Drawing Sheets

METHOD FOR FABRICATING SEMICONDUCTOR DEVICE

FIELD OF THE INVENTION

The present invention relates to a method for fabricating a semiconductor device, and more particularly to a method for fabricating a diced semiconductor device (chip).

BACKGROUND OF THE INVENTION

Typically, wafer thinning is a necessary process for fabricating semiconductor devices, such as micro-electro-mechanical system (MEMS) devices. However, thinned wafers may be frangible during wafer transition and vulnerable to the subsequent treatments for fabricating semiconductor devices. For example thinned wafers may be bowed and warped during a subsequent chemical mechanical polishing (CMP), etching step or ion implant step.

Currently, in order to resolve the problems, a temporary bonding/debonding technology thus was adopted. After integrated circuit (IC) elements are formed on the device wafer, a carrier wafer is bonded on the device wafer via an adhesive for temporary bonding, and wafer thinning steps are carried out on the backside of the device wafer. However, the temporary bonding/debonding technology not only necessitated an adhesive consisting of specific materials but also requires relatively complex processes, such that it is unlikely to reduce the processing cost of the semiconductor or MEMS devices.

Therefore, there is a need of providing an advanced method for fabricating a semiconductor device to obviate the drawbacks and problems encountered from the prior art.

SUMMARY OF THE INVENTION

Therefore, one aspect of the present invention is to provide a method for fabricating a semiconductor device, wherein the method comprises steps as follows: Firstly, a device wafer is provided and a patterned bonding layer is then formed in order to align with a scribe line region of the device wafer. Subsequently a handle wafer is bonded to the device wafer by the patterned bonding layer. Next, a dicing process is performed along the scribe line region in order to divide the device wafer into a plurality of dices and remove the patterned bonding layer simultaneously, whereby the divided dices can be separated from the handle wafer.

In one embodiment of the present invention, the formation of the patterned bonding layer comprises steps of forming a photo-resist layer on the device wafer and performing a photo-resist development process to remove a portion of the photo-resist layer in order to remain a portion of the photo-resist layer which is disposed on the scribe line region.

In one embodiment of the present invention, the formation of the patterned bonding layer comprises steps of forming an adhesive layer on the device wafer and performing an etching process to remove a portion of the adhesive layer in order to remain a portion of the adhesive layer which is disposed on the scribe line region. In one embodiment of the present invention, the adhesive layer is a resin layer or a double-sided tape layer. In one embodiment of the present invention, the adhesive layer is formed by a deposition process, a printing press process or a surface coating process carried out on the scribe line region.

In one embodiment of the present invention, the scribe line region has at least one recess, wherein a bottom of the recess is in contact with the patterned bonding layer, and the patterned bonding layer has a thickness substantially greater than a depth of the recess.

In one embodiment of the present invention, the dicing process is a laser dicing process, a saw-dicing process, an etching process or the arbitrary combinations thereof.

In one embodiment of the present invention, the method further comprises performing a wafer thinning process, an etching process or a MEMS process on the device wafer after the handle wafer is bonded to the device wafer and prior to the dicing process.

In one embodiment of the present invention, the step of bonding the handle wafer to the device wafer comprises steps of forming at least one IC element on a first surface of the device wafer, bonding a carrier wafer on the first surface of the device wafer, and bonding the handle wafer to a second surface of the device wafer opposite to the first surface. In one embodiment of the present invention, the patterned bonding layer is formed on the second surface of the device wafer before the handle wafer is bonded to the device wafer. In one embodiment of the present invention, the method further comprises steps of debonding the carrier wafer from the first surface of the device wafer before the dicing process is carried out.

In one embodiment of the present invention, the handle wafer is constituted by a glass substrate, a silicon-on-insulator (SOI) substrate or a semiconductor substrate.

In one embodiment of the present invention, the patterned bonding layer is formed on the handle wafer.

In accordance with aforementioned embodiments, a method for fabricating a semiconductor device is provided, wherein a patterned boding layer which can be removed by a subsequent dicing process is adopted in order to bond a handle wafer and a device wafer together. Since the patterned boding layer is merely formed on the scribe line region of the device wafer, thus when the device wafer is divided in to a plurality of dices, the patterned boding layer can be removed simultaneously, and the dices can be directly separated from the handle wafer without performing a redundant wafer deboding step. Accordingly, the process for fabricating the semiconductor device can be simplified and the cost thereof can be reduced.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

A method for fabricating a semiconductor device is provided to simplify the process and reduce the cost thereof. The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

FIGS. 1A through 1F illustrate cross-sectional views of a method for fabricating a semiconductor device 100 in accordance with one embodiment of the present invention, wherein the semiconductor device 100 may be an image sensor chip, an IC chip or a MEMS chip. In the present embodiment, the semiconductor device 100 is an image sensor chip.

The method for fabricating the image sensor chip comprises steps as follows: A device wafer 101 is firstly provided (see FIG. 1A). In some embodiments of the present invention, the device wafer 101 is a silicon wafer or a wafer made of SOI or other semiconductor materials. In the present embodiment, the device wafer 101 is a silicon wafer.

Figure 1A:
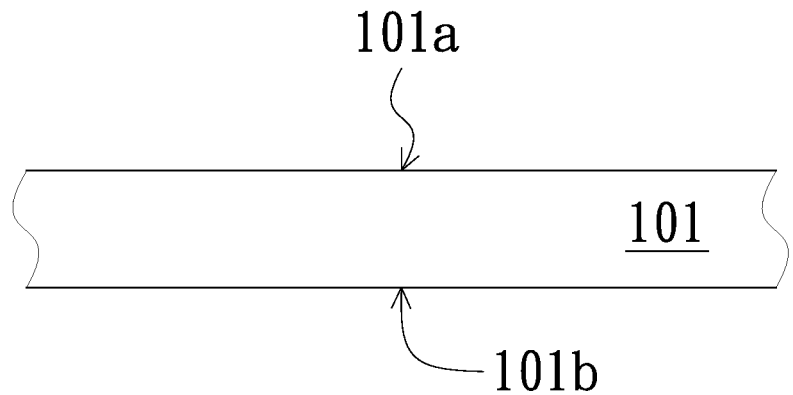
FIGS. 1A through 1F illustrate cross-sectional views of a method for fabricating a semiconductor device in accordance with one embodiment of the present invention.
Figure 1B:
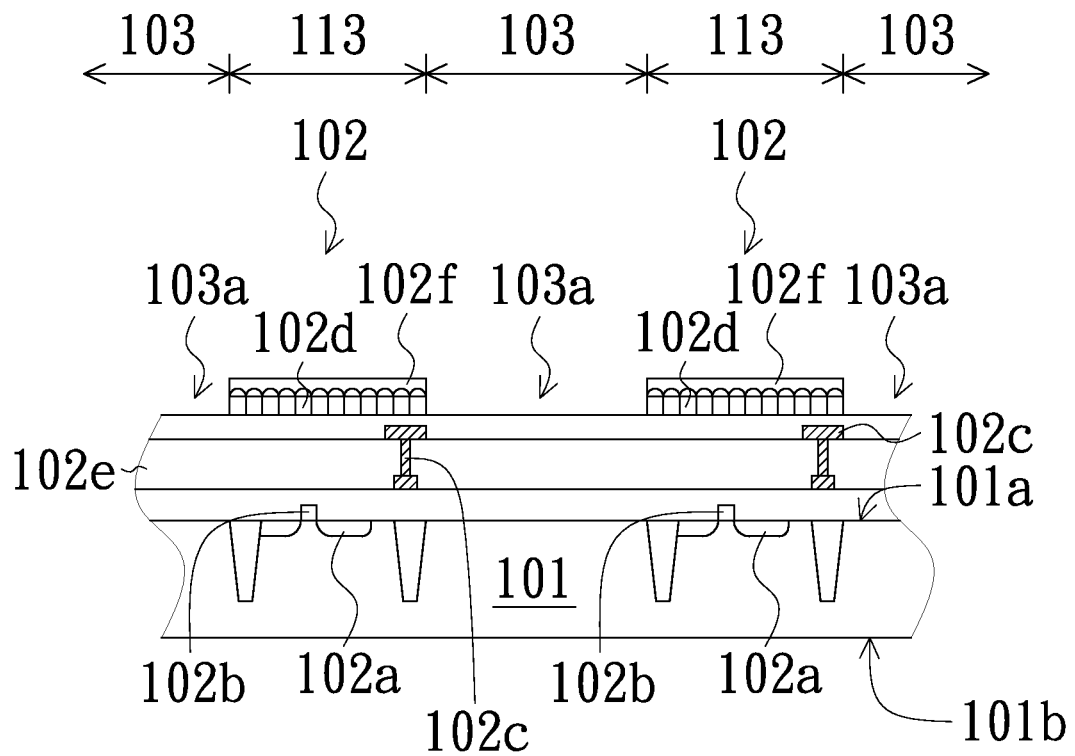

A plurality of image sensing elements 102 are then formed on the first surface 101a of the device wafer 101 and at least one scribe line region 103 is defined on the device wafer 101 in order to divide the device wafer 101 into a plurality of die regions 113. Typically each of the die regions 113 may comprise a plurality of image sensing elements 102, but in the present embodiment, only one image sensing elements 102 is depicted at each of the die regions 113 for the convenience of description (see FIG. 1B). However, it should be appreciated that FIG. 1B is just exemplarily illustrated but not intended to be exhaustive or to be limited to the precise form disclosed.

In some embodiments of the present invention, each of the image sensing elements 102 comprises a photodiode 102a, a transfer gate structure 102b, an interconnection structure 102c, a color filter 102d, at least one dielectric layer 102e and a passivation layer 102f, wherein the photodiode 102a, the transfer gate structure 102b and the interconnection structure 102c are formed on the substrate 101 and covered by the dielectric layer 102e; and the color filter 102d is formed on the dielectric layer 102e and covered by the passivation layer 102f.

Figure 2:
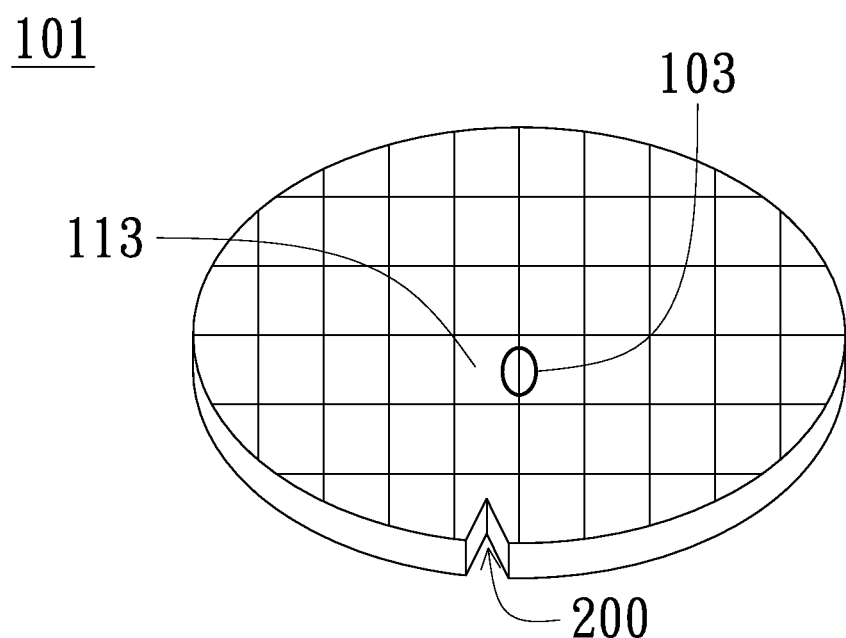
FIG. 2 illustrates a top view of a device wafer in accordance with one embodiment of the present invention.

The scribe line region 103 is a space having a certain width predetermined between two adjacent die regions 113 (image sensing elements 102). In accordance with the circuit design of the semiconductor device 100, the scribe line region 103 may be an unused space, such that, it may be occupied with some material layers which are formed by the processing steps performed on the die regions 113. Alternatively, some testing elements used for measuring some basic electrical characteristics of the semiconductor device 100 may be arranged in the scribe line region 103 in order to save wring space. In addition, for purpose of convenient definition, in some embodiments of the present invention, the scribe line region 103 is defined by a lithographic process performed on the first surface 101a of the substrate 101 in order to form a plurality of trenches (such as recesses 103a) between two adjacent image sensing elements 102. For example referring to FIG. 2, FIG. 2 illustrates a top view of a device wafer 101 in accordance with one embodiment of the present invention. The scribe line region 103 is constituted by a plurality of cross trenches (recesses 103a) formed on the device wafer 101 used to divide the device wafer 101 into a plurality of the die regions 113. In addition, an alignment mark 200, such as a notch, used for performing a subsequent dicing process may be also formed during the process for defining the scribe line region 103. In addition, some other structures, such as other alignment marks, test keys or guard rings (not shown) may be further formed on the scribe line region 103.

Figure 1C:
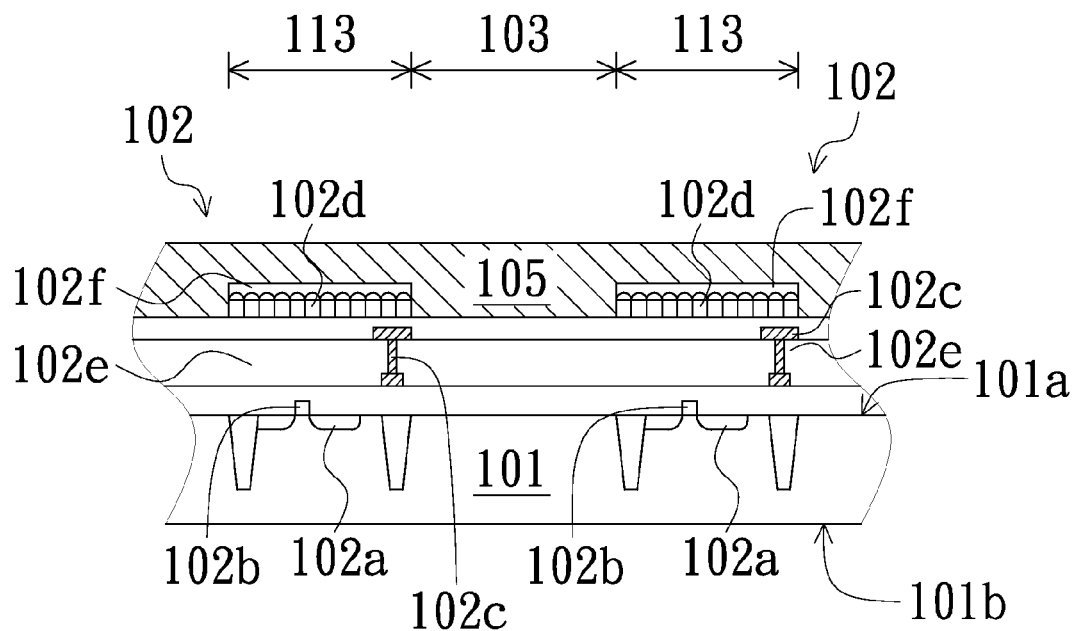
Figure 1D:
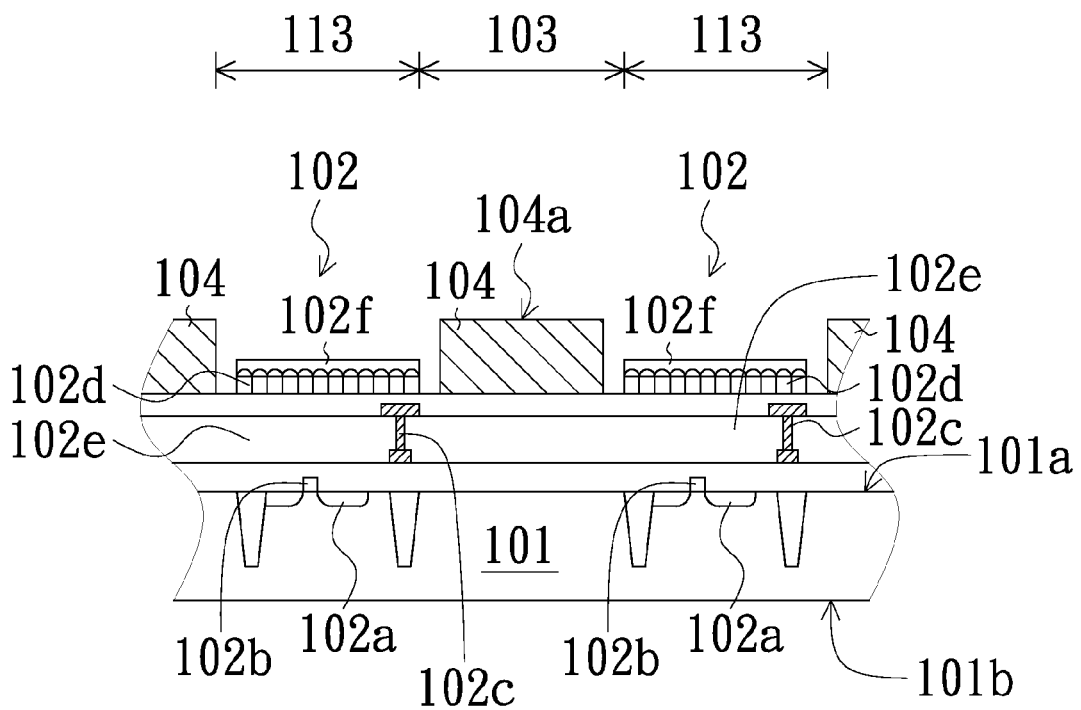

Next, a patterned bonding layer 104 is formed within the scribe line region 103. In the present embodiment, the patterned bonding layer 104 is formed on the first surface 101a of the device wafer 101. The formation of the patterned bonding layer 104 comprises steps as follows:

A covering layer 105 is firstly formed on the first surface 101a of the device wafer 101 in order to blanket over the image sensing elements 102 and fill the recess 103a of the scribe line region 103 (see FIG. 1C). Next, the covering layer 105 is patterned to remove portions of the covering layer 105 which are not disposed on the scribe line region 103, whereby a patterned boding layer 104 is formed on the scribe line region 103 (see FIG. 1D).

In some embodiments of the present invention, the covering layer 105 may be a photo-resist layer formed on the first surface 101a of the device wafer 101, wherein the portion of the photo-resist layer which does not cover the scribe line region 103 can be removed by a development process, thereby a patterned boding layer 104 consisting of photo-resist materials can be formed on the scribe line region 103.

In some other embodiments of the present invention, the covering layer 105 may be an adhesive layer constituted by a resin layer or a double-sided tape layer. In some embodiments of the present invention, the adhesive layer may be formed by a deposition process, a printing press process, paste or a spin coating process performed on the first surface 101a of the device wafer 101. An etching process may be performed by using a pattern photo-resist (not shown) covering on the scribe line region 103 as a mask to remove a portion of the adhesive layer, thereby a patterned boding layer 104 consisting of adhesive materials can be formed on the scribe line region 103.

However, it should be appreciated that although the aforementioned embodiments illustrates that the patterned boding layer 104 is fully blanket over the scribe line region 103; but in other embodiments the patterned boding layer 104 may be partially cover the scribe line region 103. For example, in the present embodiment, all of the recesses 103a formed in the scribe line region 103 may be fully filled by the patterned boding layer 104. However, in some other embodiments of the present invention, the patterned boding layer 104 merely fills some of the recesses 103a formed in the scribe line region 103.

Figure 1E:
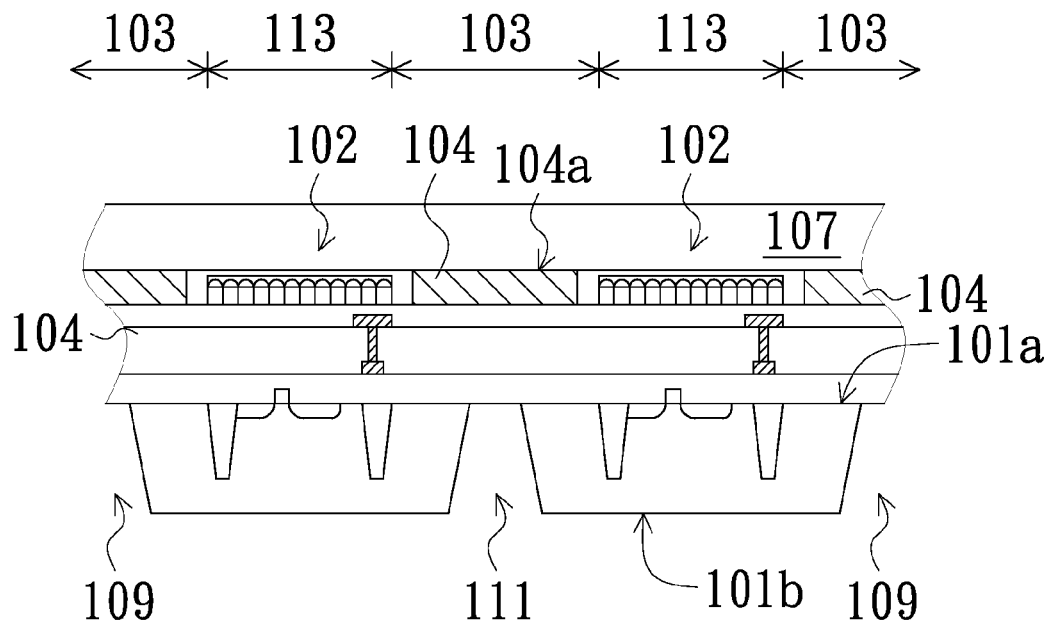

Subsequently, a handle wafer 107 is bonded to the first surface 101a of the device wafer 101 by the patterned bonding layer 104 (see FIG. 1E). In some embodiments of the present invention, the handle wafer 107 is made of but not limited a glass substrate, a SOI substrate or a silicon substrate. However, other materials may be also applied to form the handle wafer 107. In the present embodiment, the handle wafer 107 is made of a transparent glass substrate.

In the present embodiment, the patterned boding layer 104 which is formed in contact with the bottom of the recess 103a of the scribe line region 103 may extends upwards beyond the top surfaces of the adjacent imaging sensing elements 102. In other words, the patterned boding layer 104 has a thickness substantial greater than the depth of the recess 103a identified by the adjacent image sensing elements 102. Thus when the handle wafer 107 is bonded to the first surface 101a of the device wafer 101, the top surface 104a of the patterned boding layer 104 can be in contact with the handle wafer 107. Besides, since the patterned boding layer 104 is made of silicon-contained photo-resist material which has better adhesive strength to secure silicon-contained substrate, thus the handle wafer 107 can be securely tighten on the device wafer 101.

In some alternative embodiments of the present invention, the patterned boding layer 104 having a pattern coordinated with the arrangements of the scribe line region 103 can be formed on the handle wafer 107 prior to the handle wafer 107 is bonded onto the device wafer 101. Thus, when the handle wafer 107 is bonded to the first surface 101a of the device wafer 101, the patterned boding layer 104 can be aligned to and in contact with the scribe line region 103. And after a thermal process is carried out, the patterned boding layer 104 can be also securely tighten on the device wafer 101 to form the structure as shown at FIG. 1E.

After the handle wafer 107 is bonded to the first surface 101a of the device wafer 101, a wafer thinning process associated with an etching process or processes for forming other MEMSs are then carried out on a second surface 101b of the device wafer 101 opposite to the first surface 101a to thin the device wafer 101 and optionally form at least one through-hole 111 penetrating through the device wafer 101. In the present embodiment, the through-hole 111 may serve as a scribe trench for a subsequent dicing process 109.

Figure 1F:
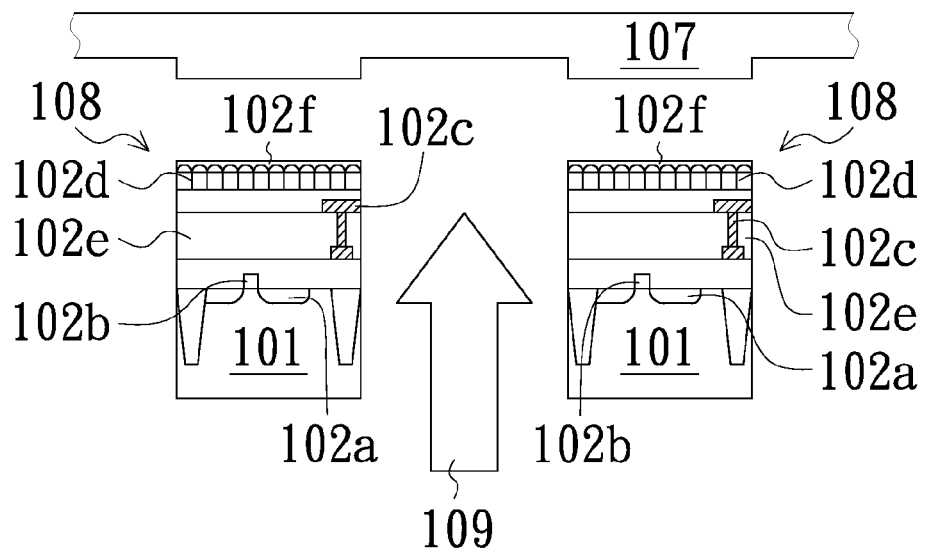

Thereafter, the dicing process 109 utilizing laser, dice saw or etching process or the combinations thereof is carried out in order to divide the device wafer 101 into a plurality of dices 108 along the scribe line region 104, as well as remove the patterned bonding layer 104 simultaneously, whereby the divided dices 108 can be separated from the handle wafer 107, meanwhile a plurality of image sensor chips (semiconductor devices 100), as shown in FIG. 1F, are completed.

Since the divided dices 108 can be separated from the handle wafer 107 by the dicing process 109, thus it is not necessary to separate the handle wafer 107 from the device wafer 101 by a debonding process prior to the dicing process 109, and the process for forming the image sensor chips (semiconductor devices 100) can be simplified. In addition, in some embodiments of the present embodiments, the handle wafer 107 may be reused after the divided dices 108 are released there from. Accordingly, the cost of the dicing process can be reduced.

FIGS. 3A through 3G illustrate cross-sectional views of a method for fabricating a semiconductor device 300 in accordance with one embodiment of the present invention, wherein the semiconductor device 100 may be an image sensor chip.

The method for fabricating the image sensor chip comprises steps as follows: A device wafer 301 is firstly provided (see FIG. 3A). In some embodiments of the present invention, the device wafer 301 is a silicon wafer or a wafer made of SOI or other semiconductor materials. In the present embodiment, the device wafer 301 is a silicon wafer.

Figure 3A:
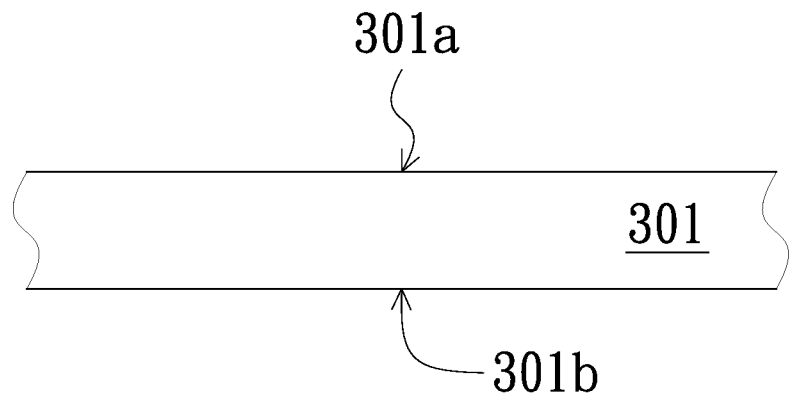
FIGS. 3A through 3G illustrate cross-sectional views of a method for fabricating a semiconductor device in accordance with one embodiment of the present invention.
Figure 3B:
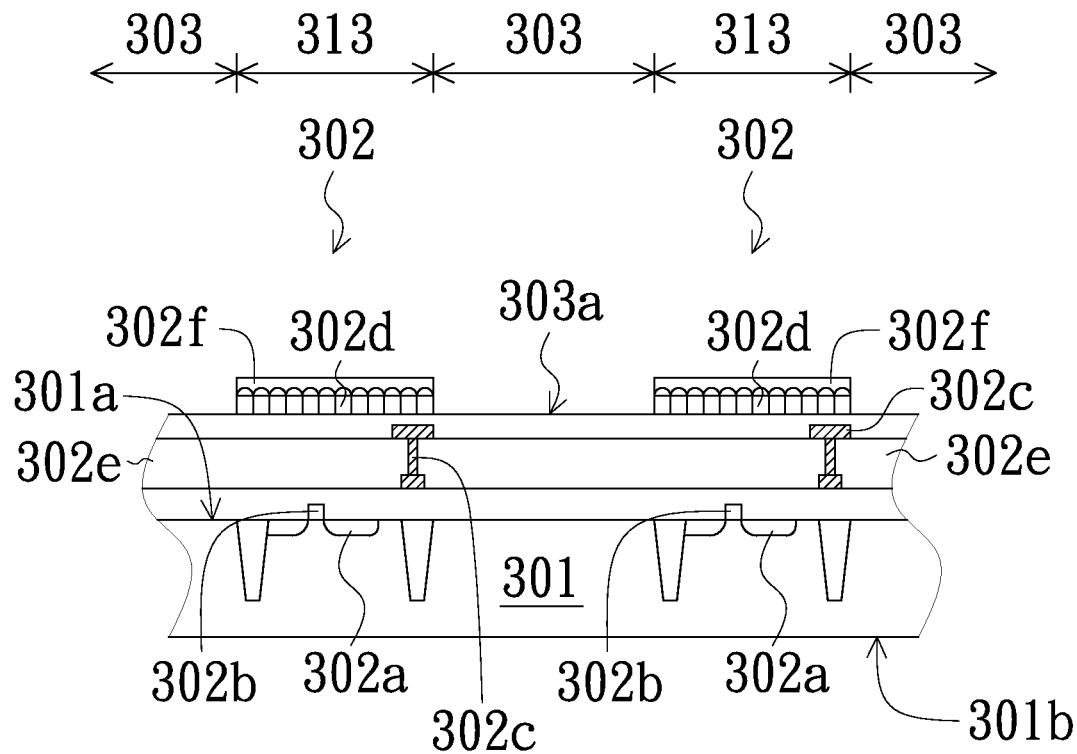

A plurality of image sensing elements 302 is then formed on the first surface 301a of the device wafer 301 and at least one scribe line region 303 is defined on the device wafer 301 in order to divide the device wafer 301 into a plurality of die regions 313. Typically each of the die regions 313 may comprise a plurality of image sensing elements 302, but in the present embodiment, only one image sensing elements 302 is depicted at each of the die regions 313 for the convenience of description (see FIG. 3B). However, it should be appreciated that FIG. 3B is just exemplarily illustrated but not intended to be exhaustive or to be limited to the precise form disclosed.

In some embodiments of the present invention, each of the image sensing elements 302 comprises a photodiode 302a, a transfer gate structure 302b, an interconnection structure 302c, a color filter 302d, at least one dielectric layer 302e and a passivation layer 302f, wherein the photodiode 302a, the transfer gate structure 302b and the interconnection structure 302c are formed on the substrate 301 and covered by the dielectric layer 302e; and the color filter 302d is formed on the dielectric layer 302e and covered by the passivation layer 302f.

In the present embodiment, the scribe line region 303 is defined by a lithographic process performed on the first surface 301a of the substrate 301 in order to form a plurality of trenches (such as recesses 103a) between two adjacent image sensing elements 302.

Next, a wafer boding process is performed to bonding a carrier wafer 306 to the first surface 101a of the device wafer 101. For example, in some embodiments of the present invention, a temporary bonding/debonding technology may be utilized using an adhesive for temporary bonding 310 to bond a carrier wafer 306 to the first surface 301a of the device wafer 301. In some embodiments of the present invention, the carrier wafer 306 may be a glass substrate, a plastic substrate, a ceramic substrate or a semiconductor substrate. In the present embodiment the carrier wafer 306 may be a glass substrate.

Figure 3C:
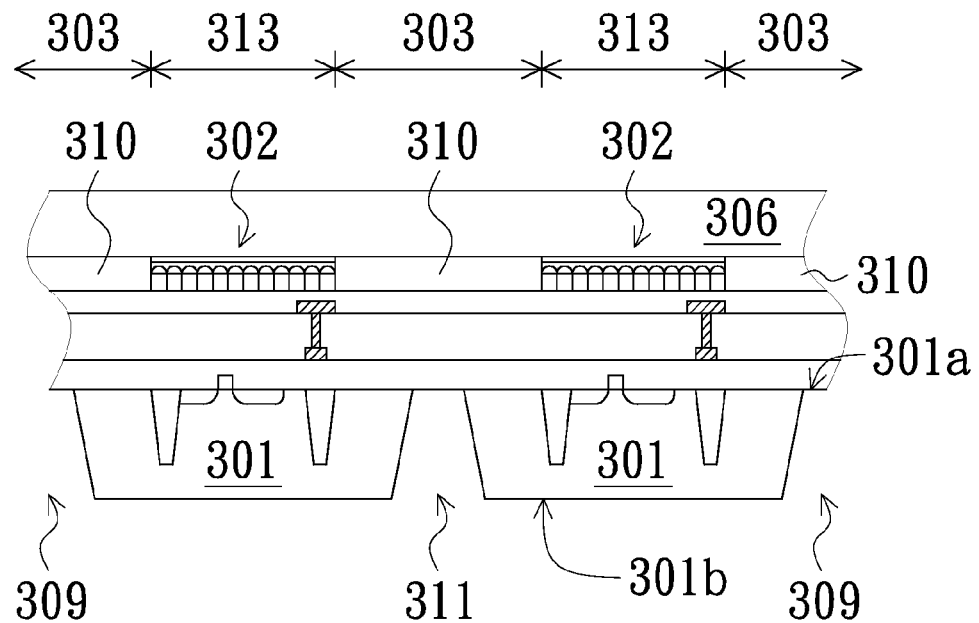

Subsequently, a wafer thinning process coordinated with an etching process or processes for forming other MEMSs are then carried out on a second surface 301b of the device wafer 301 opposite to the first surface 301a to thin the device wafer 301 and optionally form at least one through hole 311 penetrating through the device wafer 301 (see FIG. 3C). In the present embodiment, the through hole 311 may serve as a scribe trench for a subsequent dicing process 309.

Figure 3D:
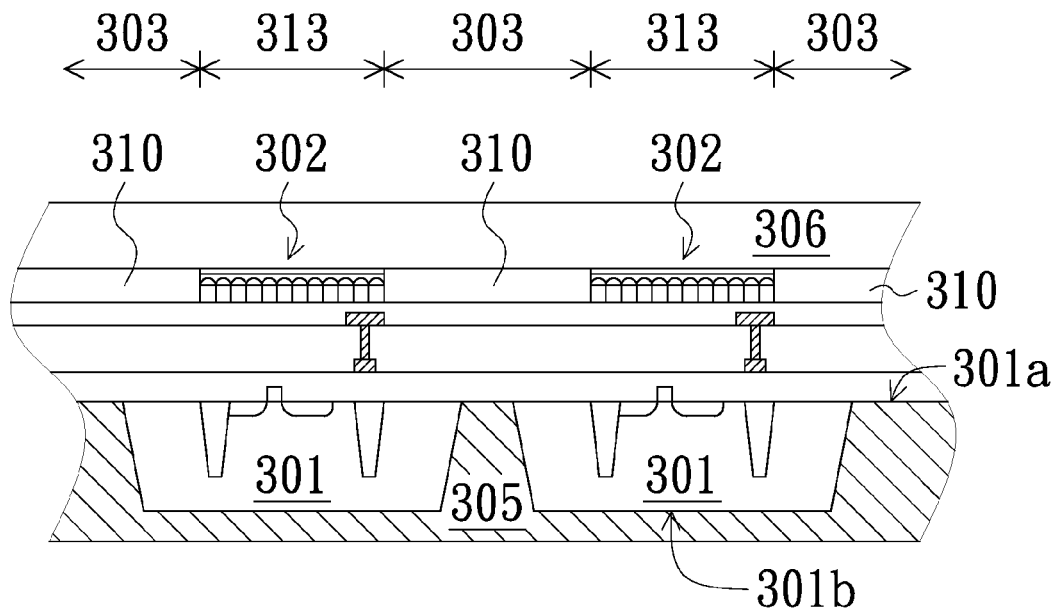

A patterned bonding layer 304 is then formed within the scribe line region 303. In the present embodiment, the patterned bonding layer 304 is formed on the second surface 301b of the device wafer 301 and aligns with the scribe line region 303 which is defined in the first surface 301a of the device wafer 301. The formation of the patterned bonding layer 304 comprises steps as follows:

A covering layer 305 is firstly formed on the second surface 301b of the device wafer 301 (see FIG. 3D). Next, the covering layer 305 is patterned to remove portions of the covering layer 305 which are not disposed on (not align with) the scribe line region 303, whereby a patterned boding layer 304 is formed on the scribe line region 303 (see FIG. 3E).

In some embodiments of the present invention, the covering layer 305 may be a photo-resist layer formed on the second surface 301b of the device wafer 301, and the portion of the photo-resist layer which does not align with the scribe line region 303 can be removed by a development process, thereby a patterned boding layer 304 consisting of photo-resist materials can be formed on the scribe line region 303.

In some other embodiments of the present invention, the covering layer 305 may be a patterned adhesive layer constituted by a resin layer or a double-sided tape layer. In some embodiments of the present invention, the patterned adhesive layer may be formed by a deposition process, a printing press process, paste or a spin coating process performed on the second surface 301b of the device wafer 301. An etching process may be performed by using a pattern photo-resist (not shown) aligning to the scribe line region 303 as the mask to remove a portion of the adhesive layer, thereby a patterned boding layer 304 consisting of adhesive materials can be formed on the scribe line region 303.

Figure 3E:
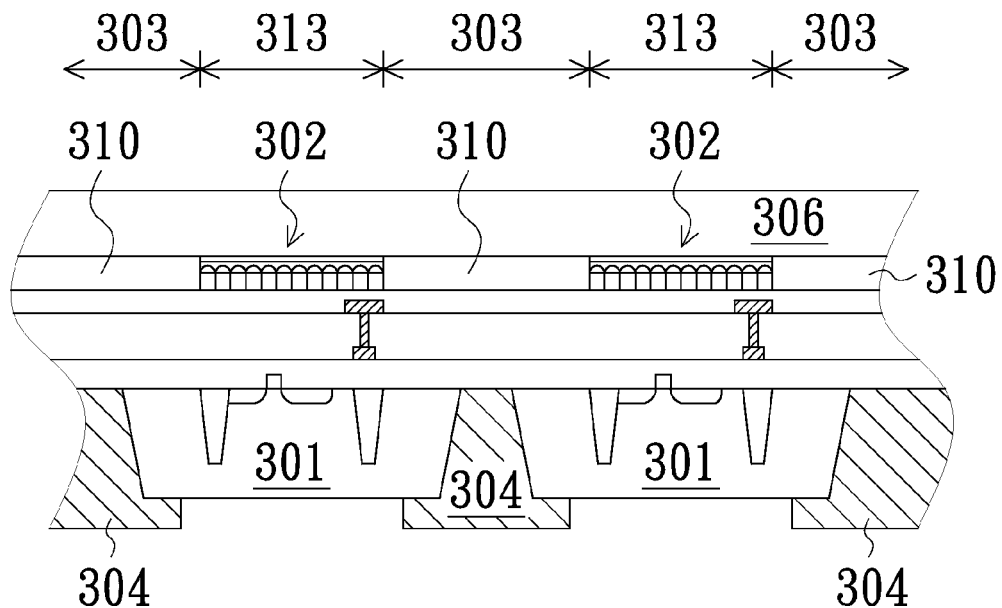
Figure 3F:
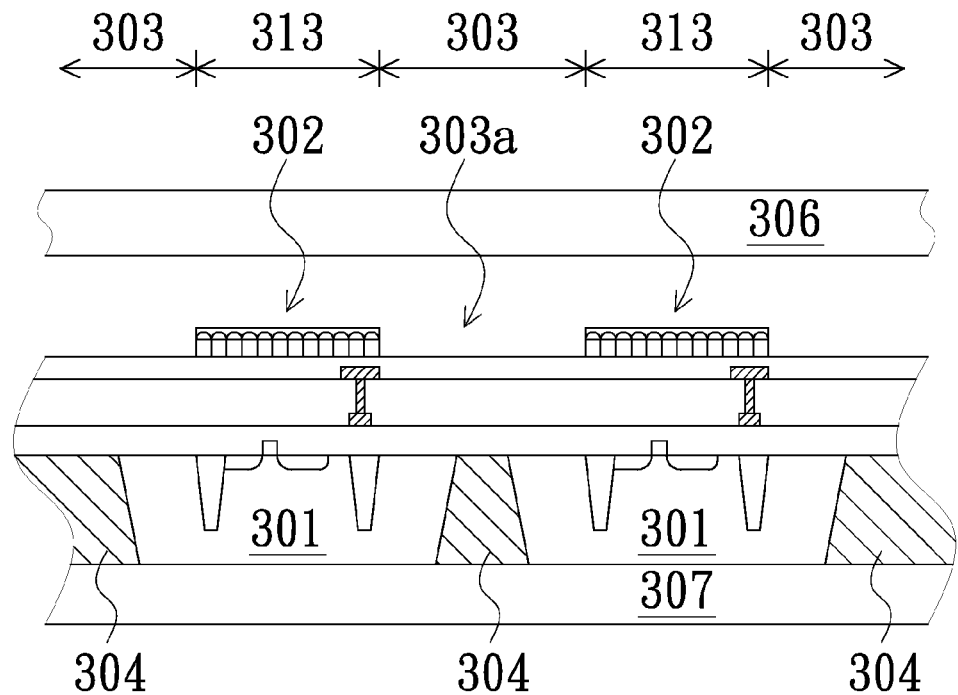

Subsequently, a handle wafer 307 is bonded to the second surface 301b of the device wafer 301 by the patterned bonding layer 304 (see FIG. 3E). In some embodiments of the present invention, the handle wafer 307 is made of but not limited a glass substrate, a SOI substrate or a silicon substrate. However, other materials may be also applied to form the handle wafer 307. In the present embodiment, the handle wafer 307 is made of a transparent glass substrate.

After the handle wafer 307 is bonded to the second surface 301b of the device wafer 301, a wafer debonding process is then performed to remove the adhesive of temporary bonding 310 and separate the carrier wafer 306 from the first surface 301a of the device wafer 301, wherein the debonding process comprises chemical treatments or UV radiation. Otherwise, in some other embodiments of the present invention, the carrier wafer 306 may be remained to serve as a protection layer of the device wafer 301 (see FIG. 3F).

Figure 3G:
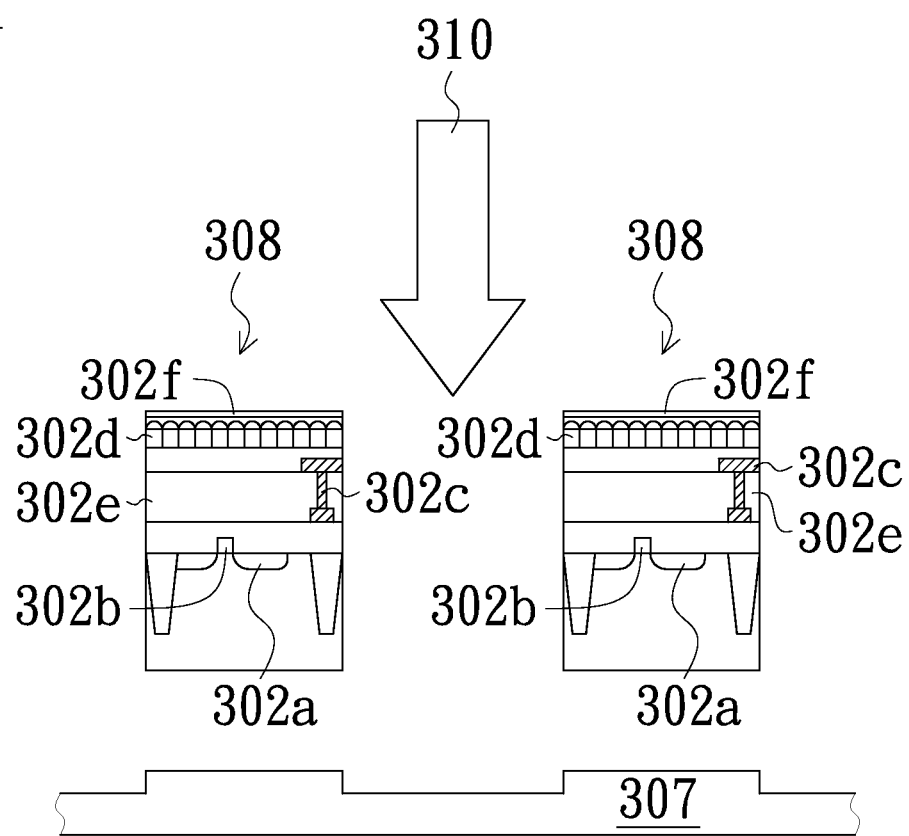

Thereafter, a dicing process 309 utilizing laser, dice saws or etching process or the combinations thereof is carried out to divide the device wafer 301 into a plurality of dices 308 along the scribe line region 104, as well as remove the patterned bonding layer 304 simultaneously, whereby the divided dices 308 can be separated from the handle wafer 307, meanwhile a plurality of image sensor chips (semiconductor devices 300), as shown in FIG. 3G, are completed.

Since the divided dices 308 can be separated from the handle wafer 307 by the dicing process 309, thus it is not necessary to separate the handle wafer 307 from the device wafer 301 by a debonding process prior to the dicing process 309, thus the process for forming the image sensor chips (semiconductor devices 300) can be simplified. In addition, in some embodiments of the present embodiments, the handle wafer 307 may be reused after the divided dices 308 are released there from. Accordingly, the cost of the dicing process can be reduced.

In accordance with aforementioned embodiments, a method for fabricating a semiconductor device is provided, wherein a patterned boding layer which can be removed by a subsequent dicing process is adopted in order to bond a handle wafer and a device wafer together. Since the patterned boding layer is merely formed on the scribe line region of the device wafer, thus when the device wafer is divided in to a plurality of dices, the patterned boding layer can be removed simultaneously by the dicing process, and the dices can be directly separated from the handle wafer without performing a redundant wafer deboding step. Accordingly, the process for fabricating the semiconductor device can be simplified and the cost thereof can be reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for fabricating a semiconductor device, comprising steps as follows:
    providing a device wafer;
    forming a patterned bonding layer in order to align with a scribe line region of the device wafer, wherein the scribe line region has at least one recess, the patterned bonding layer is in contact with a bottom of the recess, and the patterned bonding layer has a thickness substantially greater than a depth of the recess;
    bonding a handle wafer to the device wafer by the patterned bonding layer; and
    performing a dicing process along the scribe line region in order to divide the device wafer into a plurality of dices and thoroughly remove the patterned bonding layer simultaneously with the dicing process, whereby the divided dices can be separated from the handle wafer.

2. The method according to claim 1, wherein the formation of the patterned bonding layer comprises:
    forming a photo-resist layer on the device wafer; and
    performing a photo-resist development process to remove a portion of the photo-resist layer.

3. The method according to claim 1, wherein the formation of the patterned bonding layer comprises:
    forming an adhesive layer on the device wafer; and
    performing an etching process to remove a portion of the adhesive layer.

4. The method according to claim 3, wherein the adhesive layer is a resin layer or a double-sided tape layer.

5. The method according to claim 3, wherein the adhesive layer is formed by a deposition process, a printing press process or a surface coating process carried out on the scribe line region.

6. The method according to claim 1, wherein the dicing process is a laser dicing process, a saw-dicing process, an etching process or the arbitrary combinations thereof.

7. The method according to claim 1, further comprising steps of performing a wafer thinning process, an etching process or a micro-electro-mechanical system (MEMS) process on the device wafer after the handle wafer is bonded to the device wafer and prior to the dicing process.

8. The method according to claim 1, wherein the step of bonding the handle wafer to the device wafer comprises:
    forming at least one integrated circuit (IC) element on a first surface of the device wafer;
    bonding a carrier wafer on the first surface of the device wafer; and
    bonding the handle wafer to a second surface of the device wafer opposite to the first surface.

9. The method according to claim 8, wherein the patterned bonding layer is formed on the second surface of the device wafer before the handle wafer is bonded to the device wafer.

10. The method according to claim 8, further comprising steps of debonding the carrier wafer from the first surface of the device wafer before the dicing process is carried out.

11. The method according to claim 1, wherein the handle wafer is constituted by a glass substrate, a silicon-on-insulator (SOI) substrate or a semiconductor substrate.

* * * * *